US009417522B2

(12) United States Patent
Akimaru et al.

(10) Patent No.: US 9,417,522 B2
(45) Date of Patent: Aug. 16, 2016

(54) PHOTOSENSITIVE RESIN COMPOSITION AND METHOD FOR PRODUCING RESIST PATTERN

(71) Applicant: JSR Corporation, Minato-ku (JP)

(72) Inventors: Hisanori Akimaru, Minato-ku (JP);
Hirokazu Sakakibara, Minato-ku (JP);
Hidefumi Ishikawa, Minato-ku (JP);
Shingo Naruse, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 14/580,902

(22) Filed: Dec. 23, 2014

(65) Prior Publication Data

US 2015/0185604 A1  Jul. 2, 2015

(30) Foreign Application Priority Data

Dec. 27, 2013 (JP) ................................. 2013-271806
Oct. 22, 2014 (JP) ................................. 2014-215332

(51) Int. Cl.
*G03F 7/031* (2006.01)
*G03F 7/027* (2006.01)
*G03F 7/038* (2006.01)
*G03F 7/30* (2006.01)

(52) U.S. Cl.
CPC ................ *G03F 7/031* (2013.01); *G03F 7/027* (2013.01); *G03F 7/0388* (2013.01); *G03F 7/30* (2013.01)

(58) Field of Classification Search
None
See application file for complete search history.

(56) References Cited

U.S. PATENT DOCUMENTS

| | | | |
|---|---|---|---|
| 2004/0142280 A1 | 7/2004 | Iwanaga et al. | |
| 2006/0199099 A1 | 9/2006 | Arao et al. | |
| 2007/0231735 A1 | 10/2007 | Pawlowski et al. | |
| 2008/0085458 A1 | 4/2008 | Yamato et al. | |
| 2009/0087759 A1 | 4/2009 | Matsumoto et al. | |
| 2010/0188765 A1 | 7/2010 | Matsumoto et al. | |
| 2011/0081613 A1 | 4/2011 | Takeda et al. | |
| 2011/0086309 A1 | 4/2011 | Nankawa et al. | |
| 2011/0086938 A1 | 4/2011 | Nishikawa et al. | |
| 2011/0129778 A1 | 6/2011 | Murata et al. | |
| 2011/0143266 A1 | 6/2011 | Tanaka et al. | |
| 2014/0051025 A1 | 2/2014 | Tanaka et al. | |

FOREIGN PATENT DOCUMENTS

| EP | 0297583 A2 * | 1/1989 |
|---|---|---|
| EP | 1403043 A2 * | 9/2003 |
| JP | 2000-112134 A | 4/2000 |
| JP | 2003-241372 A | 8/2003 |
| JP | 2005-165012 A | 6/2005 |
| JP | 2006-243161 A | 9/2006 |
| JP | 2006-285035 A | 10/2006 |
| JP | 2008-506749 A | 3/2008 |
| JP | 2008-276194 A | 11/2008 |
| JP | 2009-519904 A | 5/2009 |
| JP | 2009-519991 A | 5/2009 |
| JP | 2009-531730 A | 9/2009 |
| JP | 2009-222923 A | 10/2009 |
| JP | 2011-123225 A | 6/2011 |
| JP | 2011-132215 A | 7/2011 |
| WO | WO 2006/112439 A1 | 10/2006 |
| WO | WO 2010/001691 A1 | 1/2010 |
| WO | WO 2010/146883 A1 | 12/2010 |

* cited by examiner

*Primary Examiner* — Cynthia Hamilton
(74) *Attorney, Agent, or Firm* — Oblon, McClelland, Maier & Neustadt, L.L.P.

(57) ABSTRACT

The present invention provides a photosensitive resin composition comprising: an alkali-soluble resin (A); a compound having at least one ethylenically unsaturated double bond per molecule (B); a photo radical polymerization initiator having a keto oxime ester structure (C); and a compound represented by the Formula (1) or (2) below (D); wherein the content of the photo radical polymerization initiator (C) is 0.5 to 5 times the content of the compound (D), and the content of the photo radical polymerization initiator (C) with respect to 100 parts by mass of the compound (B) is 3 to 20 parts by mass. In Formula (1), the six $R^1$s each independently represent a hydrogen atom or an electron-donating group, and n represents 0 or 1. In Formula (2), the six $R^2$s each independently represent a hydrogen atom or an electron-donating group, and m represents 0 or 1.

[Chemical Formula]

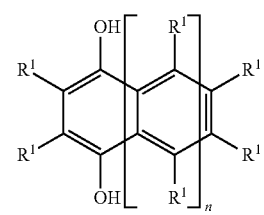

(1)

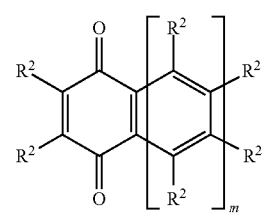

(2)

By use of the photosensitive resin composition of the present invention, formation of a resist pattern having excellent resolution is possible even without using an oxygen inhibition layer. By the method for producing a resist pattern of the present invention, formation of a resist pattern having excellent resolution is possible even without using an oxygen inhibition layer.

13 Claims, No Drawings

PHOTOSENSITIVE RESIN COMPOSITION AND METHOD FOR PRODUCING RESIST PATTERN

TECHNICAL FIELD

The present invention relates to a photosensitive resin composition and a method for producing a resist pattern that can be suitably used for production of a plated product such as a bump.

BACKGROUND ART

In recent years, large-scale integrated circuits (LSIs) for electronic devices such as mobile phones have rapidly increased their degrees of integration and numbers of layers. Thus, multipin methods for mounting an LSI on a substrate to be mounted in an electronic device have been demanded, and, for example, bare chip mounting by the tape automated bonding (TAB) method or the flip chip method is drawing attention. The former method requires highly accurate arrangement of protruding electrodes, which are connection terminals called bumps, on an LSI.

Precision components such as the bumps are produced by, for example, applying a radiosensitive resin composition to the surface of a processed product to allow formation of a resin film, patterning the resin film by photolithography, and then performing electrolytic plating or the like using the obtained resist pattern as a mask (Patent Document 1).

In cases of a radical negative-type photosensitive resin composition containing a photo-radical initiator, radicals act as active species. Thus, improvement of the pattern resolution is limited because of inhibition by oxygen contained in the air. In particular, it is known that formation of a fine pattern with a radical negative-type photosensitive resin composition causes a problem that the top of the obtained resist pattern is rounded. In order to solve this problem, a method using an oxygen inhibition layer, and the like has been proposed (Patent Documents 2 to 4).

PRIOR ART DOCUMENTS

Patent Documents

[Patent Document 1] JP 2006-285035 A
[Patent Document 2] JP 2000-112134 A
[Patent Document 3] JP 2005-165012 A
[Patent Document 4] WO 2006/112439

SUMMARY OF THE INVENTION

Problems to be Solved by the Invention

However, the method using an oxygen inhibition layer is not suitable for mass production since the process of formation of a resist pattern is complicated. Moreover, the method using an oxygen inhibition layer is not suitable for mass production since the oxygen inhibition layer needs to be selected depending on the type of the photosensitive resin composition.

The present invention aims to provide a photosensitive resin composition and a method for forming a resist pattern using the photosensitive resin composition, which allow formation of a resist pattern having excellent resolution even without using an oxygen inhibition layer.

Means for Solving the Problems

The present invention is a photosensitive resin composition comprising: an alkali-soluble resin (A); a compound having at least one ethylenically unsaturated double bond per molecule (B); a photo radical polymerization initiator having a keto oxime ester structure (C); and a compound represented by the Formula (1) or (2) below (D);
wherein
the content (mass) of the photo radical polymerization initiator (C) is 0.5 to 5 times the content (mass) of the compound (D); and
the content of the photo radical polymerization initiator (C) with respect to 100 parts by mass of the compound (B) is 3 to 20 parts by mass.

[Chemical Formula 1]

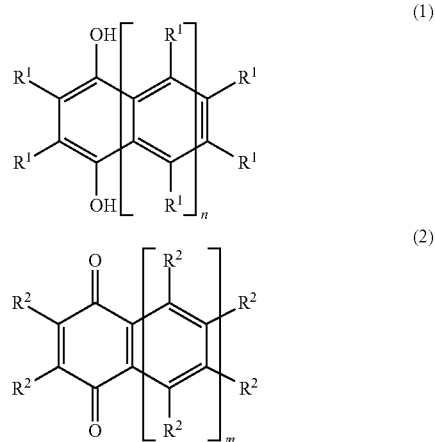

(In Formula (1), the six $R^1$s each independently represent a hydrogen atom or an electron-donating group, and n represents 0 or 1. In Formula (2), the six $R^2$s each independently represent a hydrogen atom or an electron-donating group, and m represents 0 or 1.)

In the photosensitive resin composition, the keto oxime ester structure is preferably the structure represented by the Formula (3) below.

[Chemical Formula 2]

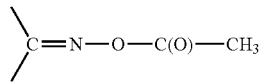

The present invention is also a method for producing a resist pattern, comprising the steps of: applying the photosensitive resin composition to a base material to form a resin coating; exposing the resin coating; and developing the exposed resin coating using an alkaline developer to allow pattern formation.

Effect of the Invention

By use of the photosensitive resin composition of the present invention, formation of a resist pattern having excellent resolution is possible even without using an oxygen inhibition layer. By the method for producing a resist pattern of the present invention, formation of a resist pattern having excellent resolution is possible even without using an oxygen inhibition layer.

MODE FOR CARRYING OUT THE INVENTION

[Photosensitive Resin Composition]

The photosensitive resin composition of the present invention comprises an alkali-soluble resin (A); a compound having at least one ethylenically unsaturated double bond per molecule (B); a photo radical polymerization initiator having a keto oxime ester structure (C); and a compound represented by the Formula (1) or (2) below (D);
wherein
the content (mass) of the photo radical polymerization initiator (C) is 0.5 to 5 times the content (mass) of the compound (D); and
the content of the photo radical polymerization initiator (C) with respect to 100 parts by mass of the compound (B) is 3 to 20 parts by mass.

[Chemical Formula 1]

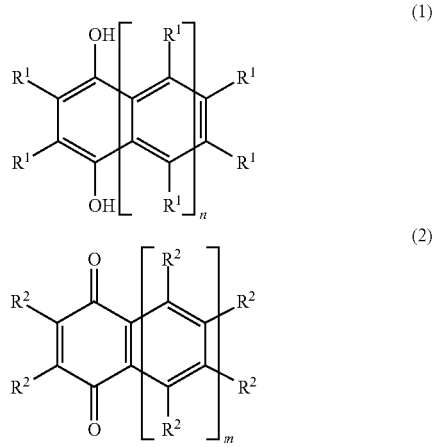

(In Formula (1), the six $R^1$s each independently represent a hydrogen atom or an electron-donating group, and n represents 0 or 1. In Formula (2), the six $R^2$s each independently represent a hydrogen atom or an electron-donating group, and m represents 0 or 1.)

As described above, in conventional radical negative-type photosensitive resin compositions containing a photo-radical initiator, the action of radicals as active species is inhibited by oxygen in the air, resulting in occurrence of phenomena such as rounding of the top of the obtained resist pattern. Thus, those compositions allow only limited improvement of the pattern resolution. The phenomenon of rounding of the top of the resist pattern is remarkable in cases where the resist pattern is fine and composed of a thin film.

The photosensitive resin composition of the present invention contains, as a photo radical polymerization initiator, a high concentration of a photo radical polymerization initiator having a keto oxime ester structure (C) which generates a large amount of various active species. As a result, the inhibition by oxygen in the air is suppressed.

On the other hand, since active species generated from a keto oxime ester-based photo radical initiator contain highly reactive active species such as methyl radicals, patterning by exposure of a resin coating obtained by application of a photosensitive resin composition containing the photo radical initiator allows the highly reactive active species to influence also unexposed portions, resulting in difficulty in resolving the pattern in some cases. One possible solution to this problem is inclusion of a high concentration of a polymerization inhibitor (quencher) to capture the highly reactive species. However, conventionally and commonly used polymerization inhibitors easily sublimate, and it is therefore assumed that their capacities to capture active species are saturated by inclusion of certain amounts of the inhibitors, resulting in insufficient effects. On the other hand, polymerization inhibitors having large molecular structures that are less likely to sublimate have low capacities to capture active species, and therefore sufficient resolution of the pattern cannot be achieved therewith.

The photosensitive resin composition of the present invention contains a high concentration of a compound (D) represented by the Formula (1) or (2) as a polymerization inhibitor. Since the compound (D) has a high capacity to capture active species, and is less likely to sublimate, saturation of the capacity to capture active species by inclusion of a certain amount of the compound does not occur. As a result, it can be assumed that use of the compound (D) allows effective capture of the active species having long diffusion lengths, and can therefore solve the problem of difficulty in resolving the pattern due to use of a keto oxime ester-based photo radical initiator.

That is, a high concentration of the photo radical polymerization initiator (C) having a keto oxime ester structure contained in the photosensitive resin composition of the present invention suppresses the inhibition by oxygen in the air. Further, a high concentration of the compound (D) contained in the composition overcomes disadvantages that may occur due to the inclusion of the photo radical polymerization initiator (C). This results in achievement of the object of the present invention, that is, formation of a resist pattern having excellent resolution, more specifically, formation of a resist pattern whose top is not rounded, without use of an oxygen inhibition layer.

The photosensitive resin composition of the present invention is concretely described below.

The photosensitive resin composition of the present invention comprises an alkali-soluble resin (A); a compound having at least one ethylenically unsaturated double bond per molecule (B); a photo radical polymerization initiator having a keto oxime ester structure (C); and a compound represented by the Formula (1) or (2) (D); and, if necessary, one or more photo radical polymerization initiators other than the photo radical polymerization initiator (C), and one or more other components.

[Alkali-Soluble Resin (A)]

The alkali-soluble resin (A) is a resin that is soluble in an alkaline developer to an extent at which the processing of interest is possible. Examples of the alkali-soluble resin include those described in JP 2008-276194 A, JP 2003-241372 A, Japanese Translated PCT Patent Application Laid-open No. 2009-531730, WO 2010/001691, JP 2011-123225 A, JP 2009-222923 A, and JP 2006-243161 A. The weight average molecular weight (Mw) of the alkali-soluble resin (A) in terms of polystyrene as determined by gel permeation chromatography is within the range of usually 1000 to 1,000,000, preferably 2000 to 50,000, more preferably 3000 to 20,000.

The alkali-soluble resin (A) preferably has a phenolic hydroxyl group in view of increasing resistance of the resist pattern to a plating solution. The alkali-soluble resin (A) having a phenolic hydroxyl group is preferably an alkali-soluble resin (A') having a structural unit represented by the Formula (4) below (hereinafter referred to as the "structural unit (4)").

[Chemical Formula 3]

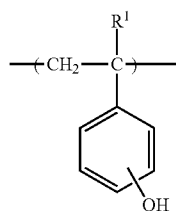

(4)

In Formula (4), $R^1$ represents a hydrogen atom or a methyl group.

By using the alkali-soluble resin (A') having the structural unit (4), a resist pattern that is unlikely to swell during the plating process can be obtained. As a result, floating or detachment of the resist pattern from the base material can be prevented, and therefore oozing of the plating solution in between the base material and the resist pattern can be prevented even in cases where the plating process is carried out for long time. Moreover, the resolution can be improved.

The content of the structural unit (4) in the alkali-soluble resin (A') having the structural unit (4) is within the range of usually 1 to 40% by mass, preferably 10 to 30% by mass. In cases where the content of the structural unit (4) is within such a range, that is, in cases where the monomers that lead to the structural unit (4) are used in such an amount, the molecular weight of the alkali-soluble resin (A') can be sufficiently increased. Moreover, a resist pattern that is less likely to swell during the plating process can be obtained.

<<Monomer (4')>>

The alkali-soluble resin (A') having the structural unit (4) can be obtained by performing polymerization using, as a part of the material monomers, a hydroxyl-containing aromatic vinyl compound(s) such as o-hydroxystyrene, m-hydroxystyrene, p-hydroxystyrene, p-isopropenylphenol and/or the like (hereinafter also referred to as the "monomer (4')"). As the monomer (4'), these compounds may be used singly, or in combination of two or more kinds thereof.

Among these monomers (4'), p-hydroxystyrene and p-isopropenylphenol are preferred from the viewpoint of obtaining a resin composition that allows formation of a resist pattern having excellent resistance to a long plating process. The monomers are more preferably p-Isopropenylphenol.

<<Monomer (I)>>

The alkali-soluble resin (A') having the structural unit (4) may further have a structural unit derived from another type of monomer (hereinafter also referred to as the "monomer (I)") that is copolymerizable with the monomer (4').

Examples of the monomer (I) include aromatic vinyl compounds such as styrene, α-methylstyrene, p-methylstyrene, and p-methoxystyrene;

heteroatom-containing alicyclic vinyl compounds such as N-vinylpyrrolidone and N-vinylcaprolactam;

(meth)acrylic acid derivatives having a glycol structure, such as phenoxydiethylene glycol(meth)acrylate, phenoxytriethylene glycol(meth)acrylate, phenoxytetraethylene glycol(meth)acrylate, phenoxypolyethylene glycol(meth)acrylate, phenoxydipropylene glycol(meth)acrylate, phenoxytripropylene glycol(meth)acrylate, phenoxytetrapropylene glycol(meth)acrylate, lauroxydiethylene glycol(meth)acrylate, lauroxytriethylene glycol(meth)acrylate, lauroxytetraethylene glycol(meth)acrylate, lauroxydipropylene glycol (meth)acrylate, lauroxytripropylene glycol(meth)acrylate, and lauroxytetrapropylene glycol(meth)acrylate;

cyano-containing vinyl compounds such as acrylonitrile and methacrylonitrile;

conjugated diolefins such as 1,3-butadiene and isoprene;

carboxyl-containing vinyl compounds such as acrylic acid and methacrylic acid;

(meth)acrylic esters such as methyl(meth)acrylate, ethyl (meth)acrylate, n-propyl(meth)acrylate, n-butyl(meth)acrylate, 2-hydroxyethyl(meth)acrylate, 2-hydroxypropyl(meth) acrylate, polyethylene glycol mono(meth)acrylate, polypropylene glycol mono(meth)acrylate, glycerol mono (meth)acrylate, phenyl(meth)acrylate, benzyl(meth)acrylate, cyclohexyl(meth)acrylate, isobornyl(meth)acrylate, and tricyclodecanyl(meth)acrylate; and p-hydroxyphenyl(meth)acrylamide.

As the monomer (I), these compounds may be used singly, or in combination of two or more kinds thereof.

Among these monomers (I), styrene, acrylic acid, methacrylic acid, methyl(meth)acrylate, ethyl(meth)acrylate, n-butyl(meth)acrylate, tricyclodecanyl(meth)acrylate, benzyl(meth)acrylate, isobornyl(meth)acrylate, p-hydroxyphenyl(meth)acrylamide, and the like are preferred.

The alkali-soluble resin (A') can be produced by, for example, radical polymerization. Examples of the method for the polymerization include emulsion polymerization, suspension polymerization, solution polymerization, and bulk polymerization.

[Compound Having at Least One Ethylenically Unsaturated Double Bond Per Molecule (B)]

The compound (B) is a component that undergoes radical polymerization by active species generated from the photo radical polymerization initiator during the exposure, and has at least one ethylenically unsaturated double bond per molecule.

The compound (B) is preferably a (meth)acrylate compound having a (meth)acryloyl group, or a compound having a vinyl group. The (meth)acrylate compounds can be classified into monofunctional (meth)acrylate compounds and polyfunctional (meth)acrylate compounds. The compound (B) may be either of these compounds.

Examples of the monofunctional (meth)acrylate compounds include 2-hydroxyethyl(meth)acrylate, 2-hydroxypropyl(meth)acrylate, 2-hydroxybutyl(meth)acrylate, methyl(meth)acrylate, ethyl(meth)acrylate, propyl(meth) acrylate, isopropyl(meth)acrylate, butyl(meth)acrylate, isobutyl(meth)acrylate, tert-butyl(meth)acrylate, pentyl (meth)acrylate, isoamyl(meth)acrylate, hexyl(meth)acrylate, heptyl(meth)acrylate, octyl(meth)acrylate, isooctyl(meth) acrylate, 2-ethylhexyl(meth)acrylate, nonyl(meth)acrylate, decyl(meth)acrylate, isodecyl(meth)acrylate, undecyl(meth) acrylate, dodecylamyl(meth)acrylate, lauryl(meth)acrylate, octadecyl(meth)acrylate, stearyl(meth)acrylate, tetrahydrofurfuryl(meth)acrylate, benzyl(meth)acrylate, phenoxyethyl (meth)acrylate, ethoxyethyl(meth)acrylate, butoxyethyl (meth)acrylate, glycerol(meth)acrylate, ethylene glycol monomethyl ether(meth)acrylate, ethylene glycol monoethyl ether(meth)acrylate, polyethylene glycol mono(meth)acrylate, polypropylene glycol mono(meth)acrylate, methoxyethylene glycol(meth)acrylate, ethoxydiethylene glycol(meth) acrylate, methoxypolyethylene glycol(meth)acrylate, methoxypolypropylene glycol(meth)acrylate, phenoxypolyethylene glycol(meth)acrylate, phenoxypolypropylene glycol(meth)acrylate, tricyclo[5.2.1.0$^{2,6}$]decadienyl(meth)acrylate, tricyclo[5.2.1.0$^{2,6}$]decanyl(meth)acrylate, tricyclo [5.2.1.0$^{2,6}$]decenyl(meth)acrylate, isobornyl(meth)acrylate, bornyl(meth)acrylate, cyclohexyl(meth)acrylate, acrylic acid amide, methacrylic acid amide, diacetone(meth)acrylamide, isobutoxymethyl(meth)acrylamide, N,N-dimethyl(meth)

acrylamide, tert-octyl(meth)acrylamide, dimethylaminoethyl(meth)acrylate, diethylaminoethyl(meth)acrylate, and 7-amino-3,7-dimethyloctyl(meth)acrylate.

Examples of the polyfunctional (meth)acrylate compounds include trimethylolpropane di(meth)acrylate, trimethylolpropane tri(meth)acrylate, trimethylolpropane PO(propylene oxide)-denatured tri(meth)acrylate, tetramethylolpropane tetra(meth)acrylate, ethylene glycol di(meth)acrylate, tetraethylene glycol di(meth)acrylate, polyethylene glycol di(meth)acrylate, 1,4-butanediol di(meth)acrylate, 1,6-hexanediol di(meth)acrylate, propylene glycol di(meth)acrylate, butylene glycol di(meth)acrylate, neopentyl glycol di(meth)acrylate, tris(2-hydroxyethyl)isocyanurate di(meth)acrylate, tris(2-hydroxyethyl)isocyanurate tri(meth)acrylate, tricyclodecane dimethanol di(meth)acrylate, epoxy(meth)acrylate prepared by adding (meth)acrylic acid to diglycidyl ether of bisphenol A, bisphenol A di(meth)acryloyloxy ethyl ether, bisphenol A di(meth)acryloyloxy methyl ethyl ether, bisphenol A di(meth)acryloyloxy ethyl oxy ethyl ether, pentaerythritol tri(meth)acrylate, pentaerythritol tetra(meth)acrylate, dipentaerythritol penta(meth)acrylate, dipentaerythritol hexa(meth)acrylate, and polyester(meth)acrylates (tri- or higher functional).

As the compound (B), a commercially available compound(s) may be used as it is/they are. Examples of the commercially available compounds include ARONIX M-210, ARONIX M-309, ARONIX M-310, ARONIX M-320, ARONIX M-400, ARONIX M-7100, ARONIX M-8030, ARONIX M-8060, ARONIX M-8100, ARONIX M-9050, ARONIX M-240, ARONIX M-245, ARONIX M-6100, ARONIX M-6200, ARONIX M-6250, ARONIX M-6300, ARONIX M-6400, and ARONIX M-6500 (these are manufactured by Toagosei Co., Ltd.); KAYARAD R-551, KAYARAD R-712, KAYARAD TMPTA, KAYARAD HDDA, KAYARAD TPGDA, KAYARAD PEG400DA, KAYARAD MANDA, KAYARAD HX-220, KAYARAD HX-620, KAYARAD R-604, KAYARAD DPCA-20, DPCA-30, KAYARAD DPCA-60, and KAYARAD DPCA-120 (these are manufactured by Nippon Kayaku Co., Ltd.); and Viscoat #295, Viscoat #300, Viscoat #260, Viscoat #312, Viscoat #335HP, Viscoat #360, Viscoat #GPT, Viscoat #3PA, and Viscoat #400 (these are manufactured by Osaka Organic Chemical Industry Ltd.).

As the compound (B), these compounds may be used singly, or in combination of two or more kinds thereof.

The amount of the compound (B) used is usually 10 to 100 parts by mass, preferably 30 to 80 parts by mass with respect to 100 parts by mass of the alkali-soluble resin (A). In cases where the amount of the compound (B) used is within this range, the compound (B) and the alkali-soluble resin (A) show excellent compatibility, and the coating liquid composed of the photosensitive resin composition has improved shelf stability. Moreover, the photosensitive resin film has good exposure sensitivity.

[Photo Radical Polymerization Initiator Having Keto Oxime Ester Structure (C)]

The photo radical polymerization initiator having a keto oxime ester structure (C) is a compound that generates radicals by light irradiation to initiate radical polymerization of the compound (B). As described above, the photo radical polymerization initiator (C) generates a large amount of various active species. As a result, the photo radical polymerization initiator (C) has a function to suppress the inhibition by oxygen in the air.

The content (mass) of the photo radical polymerization initiator (C) in the photosensitive resin composition is 0.5 to 5 times, preferably 0.55 to 4.5 times, more preferably 0.6 to 4 times the content (mass) of the compound (D). In cases where the content of the photo radical polymerization initiator (C) with respect to the compound (D) is within this range, a resist pattern having excellent resolution can be formed.

The content of the photo radical polymerization initiator (C) in the photosensitive resin composition is 3 to 20 parts by mass, preferably 4 to 15 parts by mass, more preferably 4 to 12 parts by mass with respect to 100 parts by mass of the compound (B). In cases where the content of the photo radical polymerization initiator (C) with respect to the compound (B) is within this range, a resist pattern having excellent sensitivity and resolution can be formed.

In cases where the content of the photo radical polymerization initiator (C) in the photosensitive resin composition is within this range, the function of the photo radical polymerization initiator (C) can be sufficiently exerted.

Although the photo radical polymerization initiator having a keto oxime ester structure (C) may contain geometric isomers due to the double bond of the oxime, these isomers are not distinguished from each other, and any of the geometric isomers may be included in the photo radical polymerization initiator (C).

Examples of the photo radical polymerization initiator (C) include the photo radical polymerization initiators described in WO 2010/146883, JP 2011-132215 A, Japanese Translated PCT Patent Application Laid-open No. 2008-506749, Japanese Translated PCT Patent Application Laid-open No. 2009-519904, and Japanese Translated PCT Patent Application Laid-open No. 2009-519991.

Specific examples of the photo radical polymerization initiator (C) include N-benzoyloxy-1-(4-phenylsulfanylphenyl)butan-1-one-2-imine, N-ethoxycarbonyloxy-1-phenylpropan-1-one-2-imine, N-benzoyloxy-1-(4-phenylsulfanylphenyl)octan-1-one-2-imine, N-acetoxy-1-[9-ethyl-6-(2-methylbenzoyl)-9H-carbazol-3-yl]ethane-1-imine, and N-acetoxy-1-[9-ethyl-6-{2-methyl-4-(3,3-dimethyl-2,4-dioxacyclopentanylmethyloxy)benzoyl}-9H-carbazol-3-yl]ethane-1-imine.

The keto oxime ester structure in the photo radical polymerization initiator (C) is preferably a structure represented by the Formula (3) below.

[Chemical Formula 2]

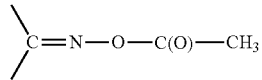

(3)

In Formula (3), 2 organic groups are bound to the carbon atom at the left end. Examples of the organic groups include alkyl groups; and groups having an aryl group(s) such as the phenylcarbazole group and/or the phenylthiobenzoyl group.

In cases where the photo radical polymerization initiator (C) has the structure represented by Formula (3) as the keto oxime ester structure, the inhibition by oxygen can be efficiently prevented, and therefore a resist pattern having excellent resolution can be formed.

Preferred examples of the photo radical polymerization initiator (C) include compounds having a structure in which a keto oxime ester structure is bound to a phenylcarbazole group. Examples of the compounds having a structure in which the keto oxime ester structure represented by Formula (3) is bound to a phenylcarbazole group include the compounds represented by the Formulae (5) and (6) below.

[Chemical Formula 4]

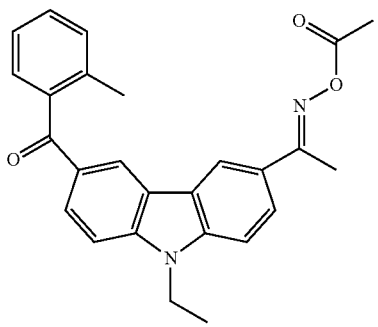
(5)

[Chemical Formula 5]

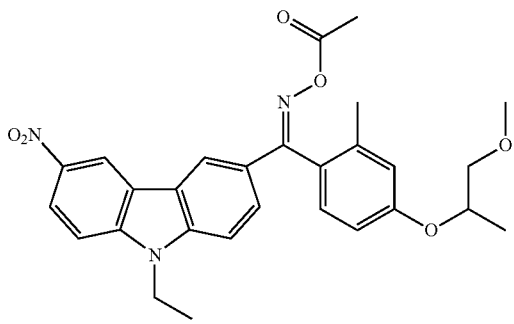
(6)

As the photopolymerization initiator (C), these compounds may be used singly, or in combination of two or more kinds thereof.

The ratio of the photo radical polymerization initiator having a keto oxime ester structure (C) in the whole photo radical polymerization initiator contained in the photosensitive resin composition of the present invention is usually not less than 5% by mass, preferably not less than 10% by mass, more preferably not less than 20% by mass.

[Photo Radical Polymerization Initiator Other than Photo Radical Polymerization Initiator (C)]

The photosensitive resin composition of the present invention may contain, as an arbitrary component, a photo radical polymerization initiator other than the photo radical polymerization initiator having a keto oxime ester structure (C), in order to control the shape and the sensitivity of the resist pattern.

Examples of the photo radical polymerization initiator other than the photo radical polymerization initiator (C) include biimidazole compounds, acylphosphine oxide compounds, alkylphenone compounds, triazine compounds, benzoin compounds, and benzophenone compounds. Examples of the biimidazole compounds include 2,2'-bis(2,4-dichlorophenyl)-4,5,4',5'-tetraphenyl-1,2'-biimidazole, 2,2'-bis(2-chlorophenyl)-4,5,4',5'-tetraphenyl-1,2'-biimidazole, 2,2'-bis(2,4-dichlorophenyl)-4,5,4',5'-tetraphenyl-1,2'-biimidazole, 2,2'-bis(2,4-dimethylphenyl)-4,5,4',5'-tetraphenyl-1,2'-biimidazole, 2,2'-bis(2-methylphenyl)-4,5,4',5'-tetraphenyl-1,2'-biimidazole, and 2,2'-diphenyl-4,5,4',5'-tetraphenyl-1,2'-biimidazole.

Examples of the alkylphenone compounds include diethoxyacetophenone, 2-hydroxy-2-methyl-1-phenylpropan-1-one, benzyldimethylketal, 2-hydroxy-1-[4-(2-hydroxyethoxy)phenyl]-2-methylpropan-1-one, 2-methyl-1-(4-methylthiophenyl)-2-morpholinopropan-1-one, 2-benzyl-2-dimethylamino-1-(4-morpholinophenyl)butan-1-one, 2-methyl-1-[4-(methylthio)phenyl]-2-morpholinopropan-1-one, 2-(2-methylbenzyl)-2-dimethylamino-1-(4-morpholinophenyl)butanone, 2-(3-methylbenzyl)-2-dimethylamino-1-(4-morpholinophenyl)butanone, 2-(4-methylbenzyl)-2-dimethylamino-1-(4-morpholinophenyl)butanone, 2-(2-ethylbenzyl)-2-dimethylamino-1-(4-morpholinophenyl)butanone, 2-(2-propylbenzyl)-2-dimethylamino-1-(4-morpholinophenyl)butanone, and 2-(2-butylbenzyl)-2-dimethylamino-1-(4-morpholinophenyl)butanone.

Examples of the acylphosphine oxide compounds include 2,4,6-trimethylbenzoyldiphenylphosphine oxide.

Examples of the triazine compounds include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine.

Examples of the benzoin compounds include benzoin, benzoin methyl ether, benzoin ethyl ether, benzoin isopropyl ether, and benzoin isobutyl ether.

Examples of the benzophenone compounds include benzophenone, o-benzoyl methyl benzoate, 4-phenylbenzophenone, 4-benzoyl-4'-methyldiphenylsulfide, 3,3',4,4'-bis(diethylamino)benzophenone, 4,4'-tetra(tert-butylperoxycarbonyl)benzophenone, and 2,4,6-trimethylbenzophenone.

As the photopolymerization initiator other than the photo radical polymerization initiator (C), these compounds may be used singly, or in combination of two or more kinds thereof.

[Compound (D) Represented by Formula (1) or (2) Below]

The compound (D) can be represented by the Formula (1) or (2) below.

[Chemical Formula 1]

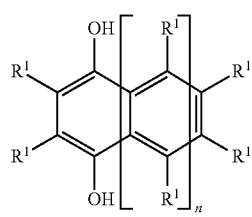
(1)

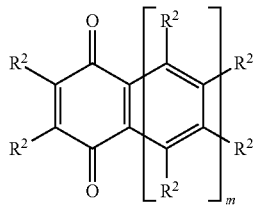
(2)

As described above, the compound (D) is a polymerization inhibitor. Since, as described above, the compound (D) has a high capacity to capture active species, and is less likely to sublimate, the compound (D) has a function to effectively capture active species having long diffusion lengths that are generated from the photo radical polymerization initiator (C).

In Formula (1), the six $R^1$s each independently represent a hydrogen atom or an electron-donating group, and n represents 0 or 1. In Formula (2), the six $R^2$s each independently represent a hydrogen atom or an electron-donating group, and m represents 0 or 1. Examples of the electron-donating group include a hydroxyl group, alkoxy group, amino group, alkylamino group, dialkylamino group, trialkylamino group, and alkyl group. Examples of the alkyl group include a methyl group, ethyl group, n-propyl group, iso-propyl group, n-butyl group, iso-butyl group, and tert-butyl group. Examples of each alkyl group contained in the alkoxy group, alkylamino group, dialkylamino group and trialkylamino group are the same as described above.

Examples of the compound (D) represented by Formula (1) include hydroquinone, 1,4-dihydroxynaphthalene, 2,5-di-tert-butylhydroquinone, and methylhydroquinone.

Examples of the compound (D) represented by Formula (2) include benzoquinone and 1,4-naphthoquinone.

Among these, 1,4-dihydroxynaphthalene, 1,4-naphthoquinone, 2,5-di-tert-butylhydroquinone, and methylhydroquinone are preferred.

As the compound (D), the above compounds may be used singly, or in combination of two or more kinds thereof.

As described above, in terms of the content (mass) of the compound (D) in the photosensitive resin composition, the compound (D) is contained such that the content (mass) of the photo radical polymerization initiator (C) in the photosensitive resin composition is 0.5 to 5 times, preferably 0.55 to 4.5 times, more preferably 0.6 to 4 times the content (mass) of the compound (D). In cases where the content of the compound (D) is within this range, the function of the compound (D) can be sufficiently exerted, and a resist pattern having excellent resolution can be formed.

[Other Components]

If necessary, the photosensitive resin composition of the present invention may contain, in addition to the above-described components, one or more of polymerization inhibitors other than the compound (D), solvents, surfactants, adhesion aids for improvement of the adhesiveness between the resin film and the substrate, sensitizers for increasing the sensitivity, inorganic fillers for improvement of the strength of the resin film, and the like, as long as these components do not deteriorate the object or properties of the present invention.

(Solvent)

Inclusion of a solvent in the resin composition of the present invention allows improvement of ease of handling, control of the viscosity, and improvement of the shelf stability of the resin composition.

Examples of the solvent include alcohols such as methanol, ethanol, and propylene glycol;

cyclic ethers such as tetrahydrofuran and dioxane;

glycols such as ethylene glycol and propylene glycol;

alkylene glycol monoalkyl ethers such as ethylene glycol monomethyl ether, propylene glycol monomethyl ether, and propylene glycol monoethyl ether;

alkylene glycol monoalkyl ether acetates such as ethylene glycol monomethyl ether acetate, propylene glycol monomethyl ether acetate, and propylene glycol monoethyl ether acetate;

aromatic hydrocarbons such as toluene and xylene;

ketones such as acetone, methyl ethyl ketone, methyl isobutyl ketone, cyclohexanone, and 4-hydroxy-4-methyl-2-pentanone;

esters such as ethyl acetate, butyl acetate, ethyl ethoxyacetate, ethyl hydroxyacetate, ethyl 2-hydroxypropionate, ethyl 2-hydroxy-2-methylpropionate, methyl 2-hydroxy-3-methylbutanoate, methyl 3-methoxypropionate, ethyl 3-methoxypropionate, ethyl 3-ethoxypropionate, methyl 3-ethoxypropionate, and ethyl lactate; and N-methylformamide, N,N-dimethylformamide, N-methylformanilide, N-methylacetoamide, N,N-dimethylacetoamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, γ-butyrolactone, ethylene carbonate, propylene carbonate, and phenyl cellosolve acetate.

The amount of ethylene glycol solvent used in the present invention is preferably not less than 50% by mass, more preferably not less than 80% by mass with respect to 100% by mass of the whole solvent. By use of an ethylene glycol-based solvent(s) as the solvent within this range, resin films having largely different film thicknesses can be more easily formed.

In cases where a resin film having a film thickness of 5 to 100 μm is to be formed, the amount of the solvent used is usually not less than 50 parts by mass, preferably 60 to 300 parts by mass, more preferably 80 to 200 parts by mass with respect to 100 parts by mass of the alkali-soluble resin (A).

(Polymerization Inhibitor Other than Compound (D))

Examples of the polymerization inhibitors other than the compound (D) include pyrogallol, methylene blue, tert-butylcatechol, monobenzyl ether, amylquinone, amyloxyhydroquinone, phenol, n-butylphenol, p-methoxyphenol, hydroquinone monopropyl ether, 4,4'-(1-methylethylidene)bis(2-methylphenol), 4,4'-(1-methylethylidene)bis(2,6-dimethylphenol), 4,4'-[1-[4-(1-(4-hydroxyphenyl)-1-methylethyl)phenyl]ethylidene]bisphenol, 4,4',4"-ethylidenetris(2-methylphenol), 4,4',4"-ethylidenetrisphenol, and 1,1,3-tris(2,5-dimethyl-4-hydroxyphenyl)-3-phenylpropane.

(Surfactant)

Inclusion of a surfactant in the photosensitive resin composition allows improvement of the coating properties, defoaming properties, leveling properties, and the like.

As the surfactant, a commercially available surfactant may be used. Specific examples of the commercially available surfactant include NBX-15, FTX-204D, FTX-208D, FTX-212D, FTX-216D, FTX-218, FTX-220D, and FTX-222D (these are manufactured by Neos Company, Ltd.); BM-1000 and BM-1100 (these are manufactured by B. M. Chemie Co., Ltd.); Megaface F142D, Megaface F172, Megaface F173, and Megaface F183 (these are manufactured by DIC Corporation); Fluorad FC-135, Fluorad FC-170C, Fluorad FC-430, and Fluorad FC-431 (these are manufactured by Sumitomo 3M Limited); Surflon S-112, Surflon S-113, Surflon S-131, Surflon S-141, and Surflon S-145 (these are manufactured by Asahi Glass Co., Ltd.); and SH-28PA, SH-190, SH-193, SZ-6032, and SF-8428 (these are manufactured by Toray, Dow Corning Silicone, Co., Ltd.). Among these, FTX-216D, FTX-218, and FTX-220D are preferred.

<Method for Preparing Photosensitive Resin Composition>

The photosensitive resin composition of the present invention can be prepared by uniformly mixing the components. In addition, in order to remove impurities, the mixture obtained by uniformly mixing the components may be filtered through a filter and/or the like.

[Method for Producing Resist Pattern]

The method for producing a resist pattern of the present invention at least comprises the steps of: applying the photosensitive resin composition to a base material to form a resin coating (hereinafter referred to as Step 1); exposing the resin coating (hereinafter referred to as Step 2); and developing the exposed resin coating using an alkaline developer to allow pattern formation (hereinafter referred to as Step 3).

[Step (1)]

The base material is not limited as long as the resin coating can be formed therewith. Examples of the base material include semiconductor substrates, glass substrates, silicon substrates, and semiconductor plates; and substrates formed by providing a metal coating or the like on the surface of a glass plate or silicon plate. The shape of the base material is not limited. The base material may be in the form of a flat plate, or may be in the form of a plate in which a recess(es) (hole(s)) is/are provided such as the base material (silicon wafer) used in the later-mentioned Examples. In cases of a base material in which a recess(es) is/are provided and which has a copper film on its surface, the bottom of each recess may be provided with the copper film as in the TSV structure.

The method for applying the photosensitive resin composition is not limited, and examples of the method include spraying, roll coating, spin coating, slit die coating, bar coating, and the ink jet method. Spin coating is especially preferred. In cases of spin coating, the rotation speed is usually 800 to 3000 rpm, preferably 800 to 2000 rpm, and the rotation time is usually 1 to 300 seconds, preferably 5 to 200 seconds. After the spin coating with the resin composition, the obtained coating is dried under heat at, for example, 50 to 250° C. for about 1 to 30 minutes.

The film thickness of the resin coating is usually 0.1 to 50 µm, preferably 0.5 to 30 µm, more preferably 1 to 20 µm, still more preferably 2 to 10 µm. The thinner the film, the more remarkably the inhibition by oxygen appears. Thus, in cases where the photosensitive resin composition of the present invention is used for the purpose of preparing a plated product, the composition is preferably used within the above-described range.

[Step (2)]

In Step (2), the resin film is selectively exposed such that a resist pattern can be obtained. For the selective exposure, the resin film is exposed usually through a desired photomask using, for example, a contact aligner, stepper, or scanner. As the exposure light, a light having a wavelength of 200 to 500 nm (e.g., i-line (365 nm)) is used. The exposure energy varies depending on the types and the amounts of the components contained in the resin film, the thickness of the coating, and the like. In cases where i-line is used as the exposure light, the exposure energy is usually 1000 to 100,000 mJ/m$^2$.

Heat treatment may be carried out after the exposure. The conditions for the heat treatment after the exposure may be appropriately determined depending on the types and the amounts of the compounds contained in the resin film, the thickness of the coating, and the like. The heat treatment is usually carried out at 70 to 180° C. for 1 to 60 minutes.

[Step (3)]

In Step (3), the resin film after the exposure is brought into contact with an aqueous alkaline solution. That is, development is performed in Step (3). In Step (3), the unexposed portion of the resin film is dissolved with a developer while the exposed portion is kept undissolved, to obtain a cured film having a predetermined pattern.

Examples of the developer that may be employed include aqueous solutions of sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and/or 1,5-diazabicyclo[4.3.0]-5-nonane. An aqueous solution prepared by adding an appropriate amount(s) of a water-soluble organic solvent(s) such as methanol and/or ethanol, and/or a surfactant (s), to the aqueous alkali solution may also be used as the developer.

The developing time varies depending on the types and the mixing ratios of the components contained in the composition, the thickness of the coating, and the like. The developing time is usually 30 to 600 seconds. The method of the development may be any of liquid application, dipping, puddling, spraying, shower development, and the like.

Additional curing of the thus prepared cured film may be carried out, depending on its use, by performing additional exposure (hereinafter referred to as "postexposure") and/or heating.

The postexposure can be carried out by the same method as in the above exposure. The exposure energy is not limited, and, in cases where a high pressure mercury lamp is used, the exposure energy is preferably 100 to 2000 mJ/cm$^2$. The heating may be carried out by heat treatment using a heating device such as a hot plate or oven at a predetermined temperature of, for example, 60 to 100° C., for a predetermined time of, for example, 5 to 30 minutes on a hot plate or 5 to 60 minutes in an oven. By this post treatment, a cured film having a pattern with even better properties can be obtained.

The patterned resin film may be washed with running water or the like. Thereafter, the resin film may be dried in the air using an air gun, or dried under heat using a hot plate, oven, or the like.

[Preparation of Plated Product]

The resist pattern produced using the photosensitive resin composition of the present invention allows preparation of a plated product such as a bump, processing of a substrate by etching, or use of the resist pattern as an insulating film, according to an ordinary method. For example, a plated product can be produced by forming a resist pattern on a base material as described in the method for producing a resist pattern, and then using the thus obtained resist pattern as a mask for performing electrolytic plating or the like.

EXAMPLES

The present invention is described below more concretely by way of Examples. However, the present invention is not limited to these Examples. In the following description of the Examples and the like, "part" represents "part by mass".

1. Method for Measuring Physical Properties

Method for Measuring Weight Average Molecular Weight (Mw) of Alkali-Soluble Resin (A)

The Mw of the alkali-soluble resin (A) was measured by gel permeation chromatography under the following conditions.

Column: Columns manufactured by Tosoh Corporation, TSK-M and TSK2500, linearly connected
Solvent: Tetrahydrofuran
Temperature: 40° C.
Detection method: Refractive index method
Reference substance: Polystyrene 2. Synthesis of Alkali-Soluble Resin (B)

Synthesis Example 1

Synthesis of Alkali-Soluble Resin (A-1)

The atmosphere in a flask equipped with a dry ice/methanol reflux apparatus was replaced with nitrogen, and 5.0 g of 2,2'-azobisisobutyronitrile as a polymerization initiator and 90 g of diethylene glycol ethyl methyl ether as a polymerization solvent were placed in the flask, followed by stirring the resulting mixture.

To the obtained solution, 11 g of methacrylic acid, 15 g of isopropenylphenol, 15 g of tricyclo[5.2.1.0$^{2,6}$]decanyl-methacrylate, 39 g of isobornyl acrylate, and 20 g of phenoxy-polyethylene glycol acrylate were added, and stirring of the resulting mixture was started, followed by increasing the temperature to 80° C. Thereafter, the mixture was heated at 80° C. for 6 hours.

Thereafter, the reaction product was added dropwise to a large amount of cyclohexane to allow coagulation. The coagulated product was washed with water, and then redissolved in an equal mass of tetrahydrofuran, followed by adding the obtained solution dropwise to a large amount of cyclohexane, to allow coagulation again. After repeating the redissolution and the coagulation operation a total of 3 times, the obtained coagulation product was dried under vacuum at 40° C. for 48 hours, to obtain an alkali-soluble resin (A-1). The weight average molecular weight (Mw) of the alkali-soluble resin (A1) was 10,000.

Synthesis Example 2

Synthesis of Alkali-Soluble Resin (A-2)

The atmosphere in a flask equipped with a dry ice/methanol reflux apparatus was replaced with nitrogen, and 5.0 g of 2,2'-azobisisobutyronitrile as a polymerization initiator and 150 g of propylene glycol monomethyl ether as a polymerization solvent were placed in the flask, followed by stirring the resulting mixture.

To the obtained solution, 10 g of methacrylic acid, 15 g of p-isopropenylphenol, 25 g of tricyclo[5.2.1.0$^{2,6}$]decanyl-methacrylate, 20 g of isobornyl acrylate, and 30 g of n-butyl methacrylate were added, and stirring of the resulting mixture was started, followed by increasing the temperature to 80° C. Thereafter, the mixture was heated at 80° C. for 7 hours.

Thereafter, the reaction product was added dropwise to a large amount of cyclohexane to allow coagulation. The coagulated product was washed with water, and then redissolved in an equal mass of tetrahydrofuran, followed by adding the obtained solution dropwise to a large amount of cyclohexane, to allow coagulation again. After repeating the redissolution and the coagulation operation a total of 3 times, the obtained coagulation product was dried under vacuum at 40° C. for 48 hours, to obtain an alkali-soluble resin A-2. The weight average molecular weight (Mw) of the alkali-soluble resin (A2) was 10,000.

3. Preparation of Photosensitive Resin Compositions

Example 1

Preparation of Photosensitive Resin Composition

A uniform solution was obtained by stirring the mixture of 100 parts of the alkali-soluble resin (A-1) as the alkali-soluble resin (A); 80 parts of polyester acrylate (trade name, "ARONIX M-8060"; manufactured by Toagosei Co., Ltd.) (B-1), 10 parts of ditrimethylolpropane tetraacrylate (B-2), and 10 parts of trimethylolpropane triacrylate (B-3), as the compound having at least one ethylenically unsaturated double bond per molecule (B); 5 parts of ethanone, 1-[9-ethyl-6-(2-methylbenzoyl)-9H-carbazol-3-yl]-, 1-(O-acetyloxime) (trade name, "IRGACURE OXE02", manufactured by Toagosei Co., Ltd; compound represented by the Formula (5)) (C-1) as the photo radical polymerization initiator having a keto oxime ester structure (C); 2 parts of 2,5-di-tert-butylhydroquinone (D-1) as the compound (D); 200 parts of propylene glycol monomethyl ether acetate (E-1) as an organic solvent; and 0.1 part of Ftergent FTX-218 (F-1) (manufactured by Neos Company, Ltd.) as a surfactant. This solution was filtered through a capsule filter having a pore size of 10 μm, to obtain the photosensitive resin composition of Example 1.

Examples 2 to 9, Comparative Examples 1 to 5

Preparation of Photosensitive Resin Compositions

In the same manner as in Example 1 except that the components listed in Table 1 were used in the amounts shown in the table, the photosensitive resin compositions of Examples 2 to 9 and Comparative Examples 1 to 5 were obtained.

Using the obtained compositions, the following evaluation was carried out.

TABLE 1

| | Component | Example 1 | Example 2 | Example 3 | Example 4 | Example 5 | Example 6 | Example 7 | Example 8 |
|---|---|---|---|---|---|---|---|---|---|
| Alkali-soluble resin (A) | A-1 | 100 parts | 100 parts | 100 parts | 100 parts | | 50 parts | | 100 parts |
| | A-2 | | | | | 100 parts | 50 parts | 100 parts | |
| Compound (B) | B-1 | 60 parts | 60 parts | 60 parts | 60 parts | 60 parts | 60 parts | 60 parts | 60 parts |
| | B-2 | 10 parts | 10 parts | 10 parts | 10 parts | 10 parts | 10 parts | 10 parts | 10 parts |
| | B-3 | 10 parts | 10 parts | 10 parts | 10 parts | 10 parts | 10 parts | 10 parts | 10 parts |
| Photo radical polymerization initiator (C) | C-1 | 5 parts | 5 parts | 6 parts | 5 parts | 4 parts | | 4 parts | 8 parts |
| | C-2 | | | | | 1 part | 3 parts | | |
| | CR-1 | | | | | | 10 parts | | |
| Compound (D) | D-1 | 2 parts | 1.5 parts | 6 parts | 8 parts | 2 parts | | 1 part | 8 parts |
| | D-2 | | | | | | 2 parts | | |
| Polymerization inhibitor other than Compound (D) | DR-1 | | | | | | | | |
| | DR-2 | | | | | | | | |
| | DR-3 | | | | | | | | |
| Solvent (E) | E-1 | 200 parts | 200 parts | 200 parts | 200 parts | 200 parts | 200 parts | 200 parts | 200 parts |
| Others (F) | F-1 | | | | | | 0.1 part | | |
| Presence/absence of inhibition by oxygen | | A | A | A | A | A | A | A | A |

TABLE 1-continued

| | Component | Example 9 | Comparative Example 1 | Comparative Example 2 | Comparative Example 3 | Comparative Example 4 | Comparative Example 5 |
|---|---|---|---|---|---|---|---|
| Alkali-soluble resin (A) | A-1 | 100 parts | 100 parts | 100 parts | 100 parts | 100 parts | 100 parts |
| | A-2 | | | | | | |
| Compound (B) | B-1 | 60 parts | 60 parts | 60 parts | 60 parts | 60 parts | 60 parts |
| | B-2 | 10 parts | 10 parts | 10 parts | 10 parts | 10 parts | 10 parts |
| | B-3 | 10 parts | 10 parts | 10 parts | 10 parts | 10 parts | 10 parts |
| Photo radical polymerization initiator (C) | C-1 | | 5 parts | 5 parts | 5 parts | 1 part | 1 part |
| | C-2 | 4 parts | | | | | |
| | CR-1 | | | | | 10 parts | |
| Compound (D) | D-1 | | | | | | |
| | D-2 | 4 parts | | | | | |
| Polymerization inhibitor other than Compound (D) | DR-1 | | 2 parts | | | | |
| | DR-2 | | | 2 parts | | | |
| | DR-3 | | | | 28 parts | | |
| Solvent (E) | E-1 | 200 parts | 200 parts | 200 parts | 200 parts | 200 parts | 200 parts |
| Others (F) | F-1 | | | | | | 0.1 part |
| Presence/absence of inhibition by oxygen | | A | C | B | B | B | B |

The following are the details of the components listed in Table 1.

A-1: The alkali-soluble resin A1, polymerized in Synthesis Example 1

A-2: The alkali-soluble resin A2, polymerized in Synthesis Example 2

B-1: Polyester acrylate (trade name, "ARONIX M-8060"; manufactured by Toagosei Co., Ltd.)

B-2: Ditrimethylolpropane tetraacrylate

B-3: Trimethylolpropane triacrylate

C-1: Ethanone, 1-[9-ethyl-6-(2-methylbenzoyl)-9H-carbazol-3-yl]-, 1-(O-acetyloxime) (trade name, "IRGACURE OXE02", manufactured by BASF)

C-2: Photo radical polymerization initiator having the structure shown in Formula (6)

CR-1: 2,2-Dimethoxy-1,2-diphenylethan-1-one (trade name, "IRGACURE 651"; manufactured by BASF)

CR-2: Diphenyl(2,4,6-trimethylbenzoyl)phosphine oxide (trade name, "LUCIRIN TPO"; manufactured by BASF)

D-1: 2,5-Di-tert-butylhydroquinone

D-2: 1,4-Naphthoquinone

DR-1: p-Methoxyphenol

DR-2: 4,4'-[1-[4-[1-(4-hydroxyphenyl)-1-methylethyl]phenyl]ethylidene]bisphenol

DR-3: Hindered phenol antioxidant (trade name, "IRGANOX 1010", manufactured by BASF)

E-1: Propylene glycol monomethylether acetate

F-1: Diglycerin ethylene oxide (average addition mole number=18); adduct, perfluorononenyl ether ("Ftergent FTX-218", manufactured by Neos Company, Ltd.)

4. Evaluation

The photosensitive resin compositions were evaluated by the following method. The results of the evaluation are shown in Table 1.

Presence/Absence of Inhibition by Oxygen

To a substrate having a copper sputtering film on a silicon plate, each composition was applied using a spin coater, and the substrate was then heated on a hot plate at 90° C. for 5 minutes to form a resin coating having a thickness of 5 μm. Subsequently, the resin coating was exposed using a stepper (manufactured by Nikon Corporation, type "NSR-2005i10D") through a pattern mask. The resin coating after the exposure was brought into contact with 2.38% by mass aqueous tetramethyl ammonium hydroxide solution for 30 seconds, and then washed with running water, followed by performing nitrogen blow to form a resist pattern. Among the obtained resist patterns, resist patterns in which the line width was the same as the space width and the line width was 2 μm were subjected to electron microscopic observation of the resist pattern shape. The presence or absence of inhibition by oxygen was determined by evaluation of the pattern shape based on the following criteria.

A: The 2-μm resist pattern could be resolved as a rectangle.

B: The 2-μm resist pattern could be resolved, but the resist pattern shape was not rectangular.

C: The 2-μm resist pattern could not be resolved.

What is claimed is:

1. A photosensitive resin composition, comprising:
(A) an alkali-soluble resin;
(B) a compound comprising an ethylenically unsaturated double bond per molecule;
(C) a photo radical polymerization initiator comprising a keto oxime ester structure; and
(D) a compound of Formula (1) or Formula (2):

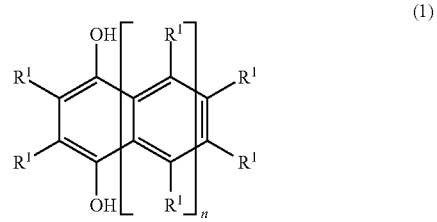

(1)

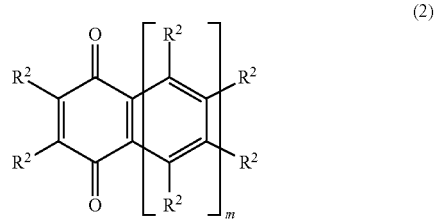

(2)

wherein, in Formula (1):
each $R^1$ independently represents a hydrogen atom or an electron-donating group; and
n represents 0 or 1,
wherein, in Formula (2):
each $R^2$ independently represents a hydrogen atom or an electron-donating group; and
m represents 0 or 1, wherein a content by mass of the photo radical polymerization initiator (C) is 0.5 to 5 times of a content by mass of the compound (D), and wherein a content of the photo radical polymerization initiator (C) with respect to 100 parts by mass of the compound (B) is 4 to 12 parts by mass.

2. The photosensitive resin composition according to claim 1, wherein the keto oxime ester structure of the photo radical polymerization initiator (C) is a structure represented by Formula (3):

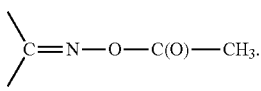

3. A method for producing a resist pattern, the method comprising:
    applying the photosensitive resin composition according to claim 2 to a base material to form a resin coating;
    exposing the resin coating to obtain an exposed resin coating; and
    developing the exposed resin coating using an alkaline developer to allow pattern formation.

4. The photosensitive resin composition according to claim 2, wherein the keto oxime ester structure of the photo radical polymerization initiator (C) is bound to a pbenylcarbazole group.

5. A method for producing a resist pattern, the method comprising:
    applying the photosensitive resin composition according to claim 1 to a base material to form a resin coating;
    exposing the resin coating to obtain an exposed resin coating; and
    developing the exposed resin coating using an alkaline developer to allow pattern formation.

6. The photosensitive resin composition according to claim 1, wherein the content by mass of the photo radical polymerization initiator (C) is 0.6 to 4 times of the content by mass of the compound (D).

7. The photosensitive resin composition according to claim 1, wherein the photo radical polymerization initiator (C) has formula (5):

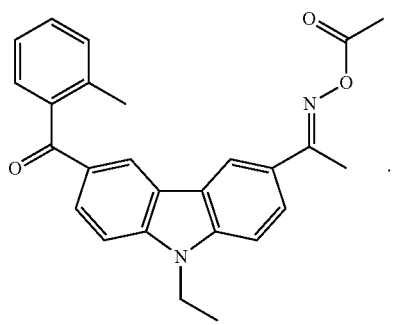

8. The photosensitive resin composition according to claim 1, wherein the photo radical polymerization initiator (C) has formula (6):

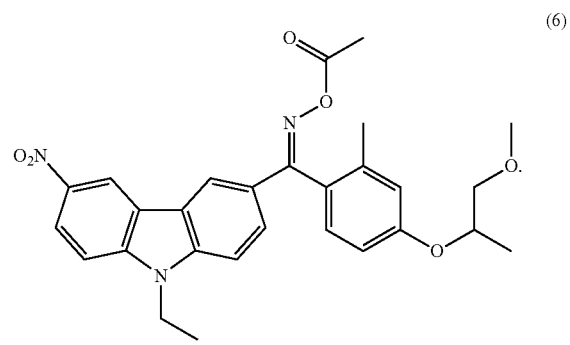 [SMILES: CCn1c2ccc(/C(=N/OC(C)=O)c3ccc(OC(C)COC)cc3C)cc2c2cc([N+](=O)[O-])ccc21]

9. The photosensitive resin composition according to claim 1, wherein the compound (D) has formula (1) and is selected from the group consisting of 1,4-dihydroxynaphthalene, 2,5-di-tert-butylhydroquinone, and methylhydroquinone.

10. The photosensitive resin composition according to claim 1, wherein the compound (D) has formula (1) and is 2,5-di-tert-butylhydroquinone.

11. The photosensitive resin composition according to claim 1, wherein the compound (D) has formula (2) and is 1,4-naphthoquinone.

12. A photosensitive resin composition, comprising:
    (A) an alkali-soluble resin;
    (B) a compound comprising an ethylenically unsaturated double bond per molecule;
    (C) a photo radical polymerization initiator comprising a keto oxime ester structure; and
    (D) a compound of Formula (1) or Formula (2):

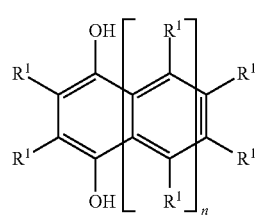

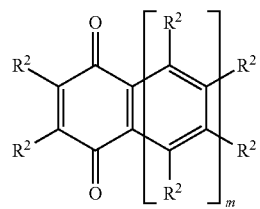

wherein, in Formula (1):
    each R' independently represents a hydrogen atom or an electron-donating group; and
    n represents 0 or 1,
wherein, in Formula (2):
    each $R^2$ independently represents a hydrogen atom or an electron-donating group; and
    m represents 0 or 1,
wherein a content by mass of the photo radical polymerization initiator (C) is 0.6 to 4 times of a content by mass of the compound (D), and
wherein a content of the photo radical polymerization initiator (C) with respect to 100 parts by mass of the compound (B) is 3 to 20 parts by mass.

13. A photosensitive resin composition, comprising:
(A) an alkali-soluble resin;
(B) a compound comprising an ethylenically unsaturated double bond per molecule;
(C) a photo radical polymerization initiator comprising a keto oxime ester structure; and
(D) a compound selected from the group consisting of 1,4-dihydroxynaphthalene, 2,5-di-tert-butylhydroquinone, methylhydroquinone, and 1,4-naphthoquinone,
wherein a content by mass of the photo radical polymerization initiator (C) is 0.5 to 5 times of a content by mass of the compound (D), and
wherein a content of the photo radical polymerization initiator (C) with respect to 100 parts by mass of the compound (B) is 3 to 20 parts by mass.

* * * * *